(12) United States Patent
Yamada

(10) Patent No.: US 9,780,754 B2
(45) Date of Patent: Oct. 3, 2017

(54) NOISE REMOVAL CIRCUIT OF WIRE HARNESS AND WIRE HARNESS ASSEMBLY INCLUDING THE SAME

(71) Applicant: Yazaki Corporation, Tokyo (JP)

(72) Inventor: Kunihiko Yamada, Makinohara (JP)

(73) Assignee: Yazaki Corporation, Tokyo (JP)

( * ) Notice: Subject to any disclaimer, the term of this patent is extended or adjusted under 35 U.S.C. 154(b) by 132 days.

(21) Appl. No.: 14/680,301

(22) Filed: Apr. 7, 2015

(65) Prior Publication Data

US 2015/0296298 A1 Oct. 15, 2015

(30) Foreign Application Priority Data

Apr. 14, 2014 (JP) ................................. 2014-083119
Apr. 14, 2014 (JP) ................................. 2014-083120
Apr. 14, 2014 (JP) ................................. 2014-083121

(51) Int. Cl.
*H03H 7/00* (2006.01)
*H03H 1/00* (2006.01)
*H03H 7/01* (2006.01)

(52) U.S. Cl.
CPC ........ *H03H 1/0007* (2013.01); *H03H 7/0115* (2013.01)

(58) Field of Classification Search
CPC ........................... H03H 1/0007; H03H 7/0115
USPC ....................................................... 333/181
See application file for complete search history.

(56) References Cited

U.S. PATENT DOCUMENTS

| 8,410,867 B2 | 4/2013 | Kiefer | |
| 8,680,948 B2 | 3/2014 | Shirakawa et al. | |
| 8,994,475 B2 * | 3/2015 | Nishioka | H03H 7/0115 333/181 |
| 9,362,881 B2 * | 6/2016 | Aizawa | H03H 1/0007 |
| 2012/0081194 A1 | 4/2012 | Nishioka et al. | |
| 2012/0306217 A1 | 12/2012 | Shoji | |

FOREIGN PATENT DOCUMENTS

| CN | 102449904 A | 5/2012 |
| DE | 10 2009 014 859 A1 | 10/2010 |
| DE | 10 2011 053 983 A1 | 4/2012 |

(Continued)

OTHER PUBLICATIONS

Office Action dated Aug. 19, 2015, issued for the German patent application No. 10 2015 206 620.7 and English translation thereof.

(Continued)

*Primary Examiner* — Robert Pascal
*Assistant Examiner* — Kimberly Glenn
(74) *Attorney, Agent, or Firm* — Locke Lord LLP

(57) ABSTRACT

The branch portion includes: a first circuit portion electrically connected to the main wire while extending to a leading end from a base end of the branch portion; a second circuit portion electrically connected to the main wire while extending to the leading end from the base end of the branch portion and electrically connected to the first circuit portion at the leading end of the branch portion; and a ground conductor that is disposed between the first circuit portion and the second circuit portion while extending to the leading end from the base end of the branch portion and has one end to be grounded and the other end to be opened.

8 Claims, 17 Drawing Sheets

(56) References Cited

FOREIGN PATENT DOCUMENTS

| GB | 2472729 A |   | 2/2011 |
|----|-----------|---|--------|
| JP | 08148959 A | * | 6/1996 |
| JP | 2009-111832 A |   | 5/2009 |
| JP | 2012-039201 A |   | 2/2012 |

OTHER PUBLICATIONS

Office Action dated May 2, 2017 issued for corresponding Chinese Patent Application No. 2015 101 75934.3.

* cited by examiner

PRIOR ART

NOISE REMOVAL CIRCUIT OF WIRE HARNESS AND WIRE HARNESS ASSEMBLY INCLUDING THE SAME

BACKGROUND

Technical Field

The present invention relates to a noise removal circuit of a wire harness mounted on, for example, a vehicle and a wire harness assembly including the noise removal circuit.

Related Art

From the past, various noise removal circuits have been used to remove electric noise carried on a wire harness. For example, a noise removal circuit of a wire harness has been frequently used in the vehicle as illustrated in FIG. 19 (see JP 2009-111832 A).

A noise removal circuit 510 of a wire harness WH illustrated in FIG. 19 is a circuit in which from a main wire 6 bundled with a plurality of electric wires 60, 61, and 62, the electric wires 61 and 62 serving as a noise removal target are branched, a noise filter portion 501 configured in a unit form is connected to a leading end of electric-wire branched portions 61a and 62a, and the noise filter portion 501 is fixed to a vehicle body panel with a bolt and thus is grounded (body ground). The pair of electric-wire branched portions 61a and 62a extend toward the noise filter portion 501 in parallel with each other and an outer peripheries thereof are wound by, for example, a tape. The noise filter portion 501 extracts noise (high frequency noise) from a current input from the electric-wire branched portion 61a to drop the extracted noise to a ground and outputs the noise-extracted current to the electric-wire branched portion 62a.

PATENT LITERATURE

Patent Literature 1: JP 2009-111832 A
Patent Literature 2: JP 2012-039201 A

SUMMARY

In the traditional noise removal circuit 510 described above, as indicated by an arrow N in FIG. 19, there is a problem that noise propagates to the electric-wire branched portion 62a from the electric-wire branched portion 61a without passing through the noise filter portion 501 due to an inter-line capacitance. In addition, when the noise filter portion 501 is located far from the main wire 6 of the wire harness WH, the above-described noise propagation easily occurs in particular.

Accordingly, the invention relates to a noise removal circuit in which a noise filter portion is provided in a branch portion branched from a main wire of a wire harness and an object thereof is to provide a noise removal circuit of a wire harness capable of removing noise with high accuracy and a wire harness assembly including the same.

A first aspect of the invention is a noise removal circuit of a wire harness including: a branch portion that is branched from a main wire of the wire harness; and a noise filter portion that is provided in the branch portion to be grounded, wherein the branch portion includes: a first circuit portion that is electrically connected to the main wire while extending to a leading end from a base end of the branch portion; a second circuit portion that is electrically connected to the main wire while extending to the leading end from the base end of the branch portion and is electrically connected to the first circuit portion at the leading end of the branch portion; and a ground conductor that is disposed between the first circuit portion and the second circuit portion while extending to the leading end from the base end of the branch portion and has one end to be grounded and the other end to be opened.

A second aspect of the invention according to the first aspect of the invention is the first circuit portion including a first inductance forming portion and the second circuit portion including a second inductance forming portion.

A third aspect of the invention according to the first or second aspect of the invention is the branch portion being separately divided into a branch line branched from the main wire and a filter constituting portion constituting the noise filter portion; the noise filter portion being configured in a unit form in which the filter constituting portion is accommodated in a housing; and the branch line and the noise filter portion being connected to each other using a connector.

A fourth aspect of the invention according to any one of the first to third aspects of the invention is a metal plate being grounded or forming a ground being disposed along the branch portion.

A fifth aspect of the invention is a wire harness assembly including: the noise removal circuit of the wire harness according to any one of the first to fourth aspects; and a wire harness from which noise is removed by the noise removal circuit.

According to the first, third, and fifth aspects of the invention, since the branch portion includes the ground conductor that is disposed between the first circuit portion and the second circuit portion while extending to the leading end from the base end of the branch portion and has one end to be grounded and the other end to be opened, even when the first circuit portion and the second circuit portion come close to each other and the noise filter portion is located far from the main wire of the wire harness, it is possible to hardly cause the noise propagation due to an inter-line capacitance between the first circuit portion and the second circuit portion. Accordingly, the noise can be removed with high accuracy.

According to the second aspect of the invention, it is possible to hardly cause the noise propagation by the ground conductor even between the pair of inductance forming portions in which the noise propagation easily occurs due to the electrostatic coupling.

According to the fourth aspect of the invention, since the metal plate being grounded or forming a ground is disposed along the branch portion, it is possible to more hardly cause the noise propagation between the first circuit portion and the second circuit portion.

DETAILED DESCRIPTION (First Embodiment)

Figure 1:
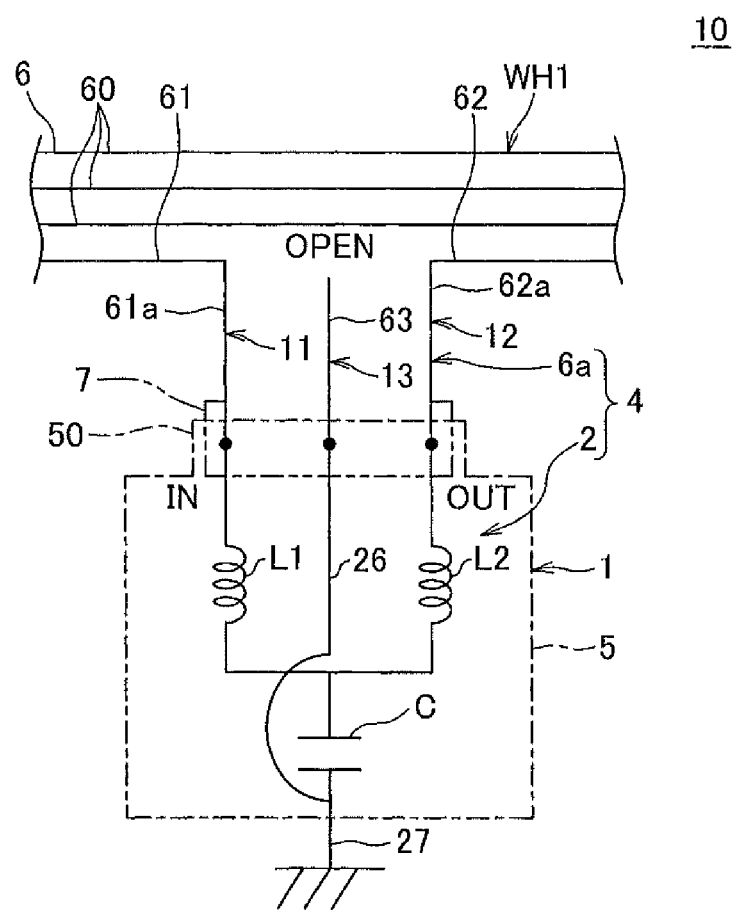
FIG. 1 is a circuit diagram of a noise removal circuit of a wire harness according to a first embodiment of the invention.

A "noise removal circuit of a wire harness" and a "wire harness assembly" according to a first embodiment of the invention will be described with reference to FIGS. 1 to 4. A "noise removal circuit 10 of a wire harness" illustrated in FIG. 1 is a circuit for removing noise of a wire harness WH1 which is laid to a vehicle to connect devices mounted on the vehicle with each other, and includes a "branch portion 4" which is branched from a main wire 6 of the wire harness WH1 and a "noise filter portion 1" which is provided in the branch portion 4 and is grounded. The noise removal circuit 10 and the wire harness WH1 from which the noise is removed by the noise removal circuit 10 constitute the "wire harness assembly".

As illustrated in FIG. 1, the branch portion 4 includes: a first circuit portion 11 which is electrically connected to the main wire 6 bundled with a plurality of electric wires 60, 61, and 62 while extending to a leading end from a base end of the branch portion 4; a second circuit portion 12 which is electrically connected to the main wire 6 while extending to the leading end from the base end of the branch portion 4 and is electrically connected to the first circuit portion 11 at the leading end of the branch portion 4; and a ground conductor 13 which is disposed between the first circuit portion 11 and the second circuit portion 12 while extending to the leading end from the base end of the branch portion 4 and has one end to be grounded and the other end to be opened.

Thus, in the noise removal circuit 10, since the branch portion 4 includes the ground conductor 13 which is disposed between the first circuit portion 11 and the second circuit portion 12 while extending to the leading end from the base end of the branch portion 4 and has one end to be grounded and the other end to be opened, even when the first circuit portion 11 and the second circuit portion 12 come close to each other and the noise filter portion 1 is located far from the main wire 6 of the wire harness WH1, it is possible to hardly cause the noise propagation due to an inter-line capacitance between the first circuit portion 11 and the second circuit portion 12. Accordingly, the noise can be removed with high accuracy.

In addition, the branch portion 4 is separately divided into a branch line 6a branched from the main wire 6 and a filter constituting portion 2 constituting the noise filter portion 1. The noise filter portion 1 is configured in a unit form in which the filter constituting portion 2 is accommodated in a housing 5. The branch line 6a and the noise filter portion 1 are connected to each other using a connector.

Figure 2:
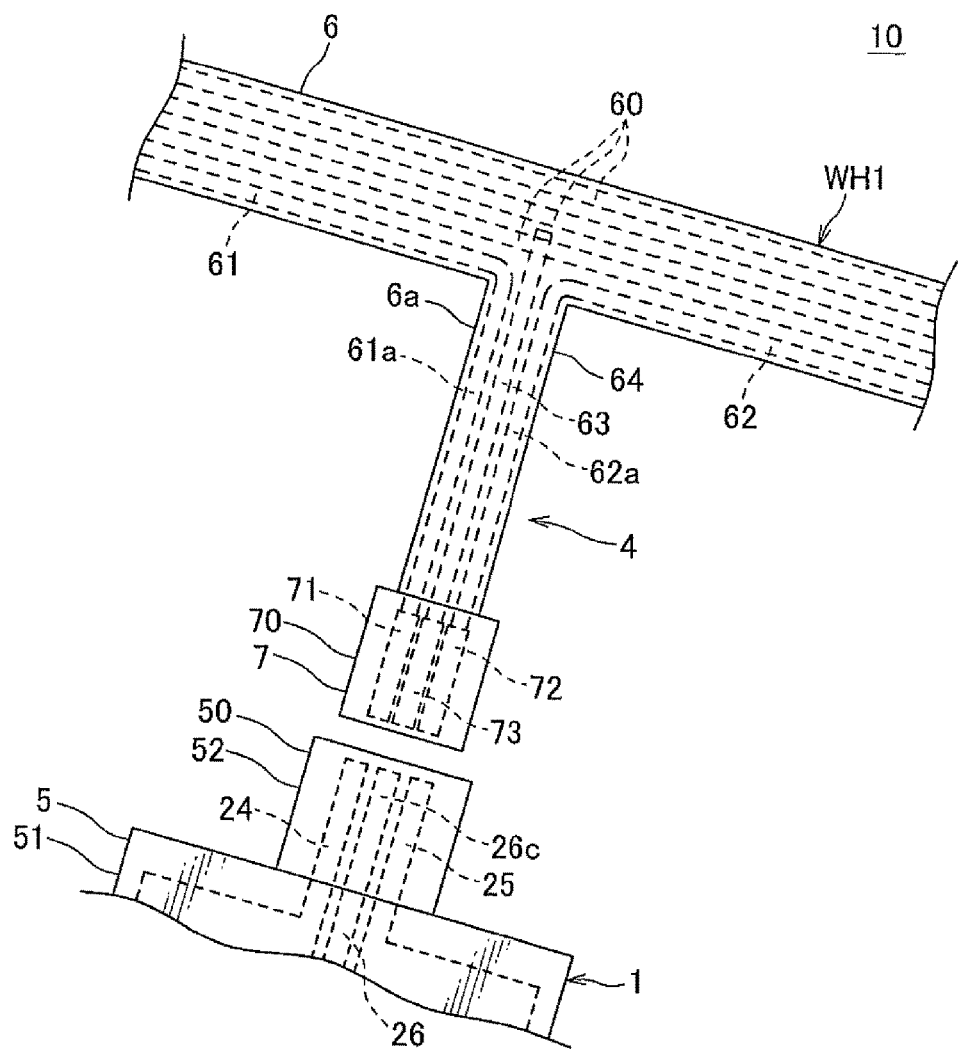
FIG. 2 is an explanatory diagram describing a configuration of the wire harness illustrated in FIG. 1.

As illustrated in FIG. 2, the branch line 6a includes: a pair of electric-wire branched portions 61a and 62a in which the electric wires 61 and 62 serving as a noise removal target among the electric wires 60, 61, and 62 of the main wire 6 are branched from the main wire 6 to extend in parallel with each other; a ground electric wire 63 which is disposed between the electric-wire branched portions 61a and 62a and has a side (main wire 6 side) to be opened which is far from the noise filter portion 1; female terminals 71 and 72 which are attached to leading ends of the electric-wire branched portions 61a and 62a, respectively; a female terminal 73 which is attached to a leading end of the ground electric wire 63; and a connector housing 70 which accommodates these terminals 71, 72, and 73. The terminals 71, 72, and 73 and the connector housing 70 constitute a connector 7. In addition, each of the electric-wire branched portion 61a (that is, the electric wire 61), the electric-wire branched portion 62a (that is, the electric wire 62), and the ground electric wire 63 is a coated electric wire in which a core is covered with an insulation coating.

The ground electric wire 63 extends between the pair of electric-wire branched portions 61a and 62a in parallel with these portions. In addition, an end of the ground electric wire 63 far from the noise filter portion 1 is located in the vicinity of the center in a radial direction of the main wire 6 and is not electrically connected to any portions. A tape 64 is wound on outer peripheries of the electric-wire branched portions 61a and 62a and the ground electric wire 63, so that the positional relation between these electric wires is fixed (the ground electric wire 63 is located at the center).

In addition, the outer peripheries of the pair of electric-wire branched portions 61a and 62a and the ground electric wire 63 are wound by the tape 64, so that the positional relation therebetween is fixed, but other than the above, the pair of electric-wire branched portions 61a and 62a and the ground electric wire 63 may be bonded to each other such that the positional relation therebetween is fixed.

Thus, since the ground electric wire 63 is disposed between the pair of electric-wire branched portions 61a and 62a, even when the electric-wire branched portions 61a and 62a come close to each other and the branch line 6a extends long, the noise propagation due to an inter-line capacitance hardly occurs between the electric-wire branched portion 61a and the electric-wire branched portion 62a. That is, when the noise is transmitted to the electric-wire branched portion 62a from the electric-wire branched portion 61a without passing through the noise filter portion 1, since the noise is transmitted to the ground electric wire 63 which is closer than the electric-wire branched portion 62a and drops to a ground, the noise propagation hardly occurs between the electric-wire branched portion 61a and the electric-wire branched portion 62a.

In the branch line 6a described above, the electric-wire branched portion 61a and the terminal 71 constitute a part of the "first circuit portion 11". In addition, the electric-wire branched portion 62a and the terminal 72 constitute a part of the "second circuit portion 12". In addition, the electric-wire branched portion 62a and the terminal 73 constitute a part of the "ground conductor 13".

Figure 3:
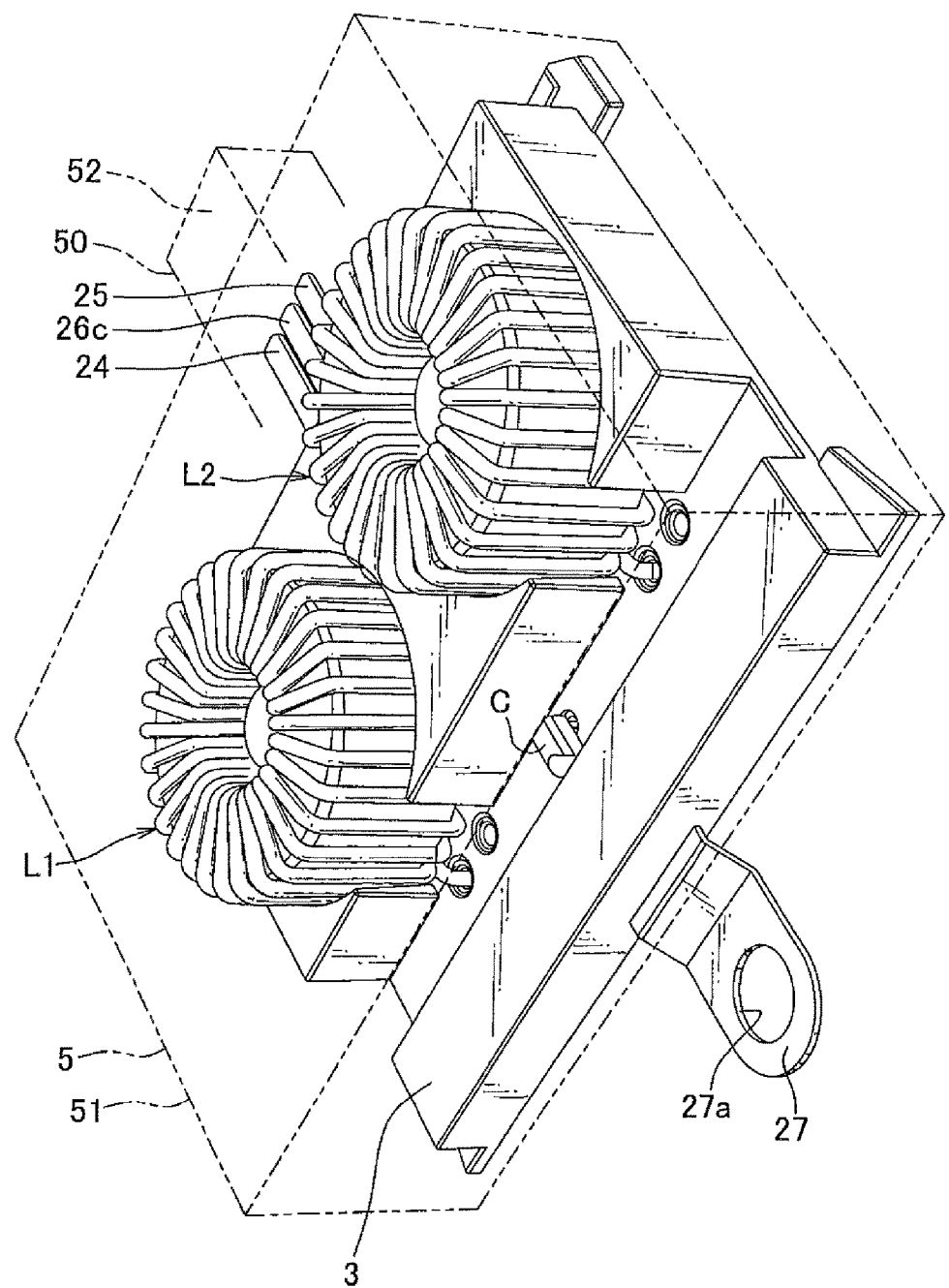
FIG. 3 is a perspective view of a noise filter portion constituting the noise removal circuit illustrated in FIG. 1.
Figure 4:
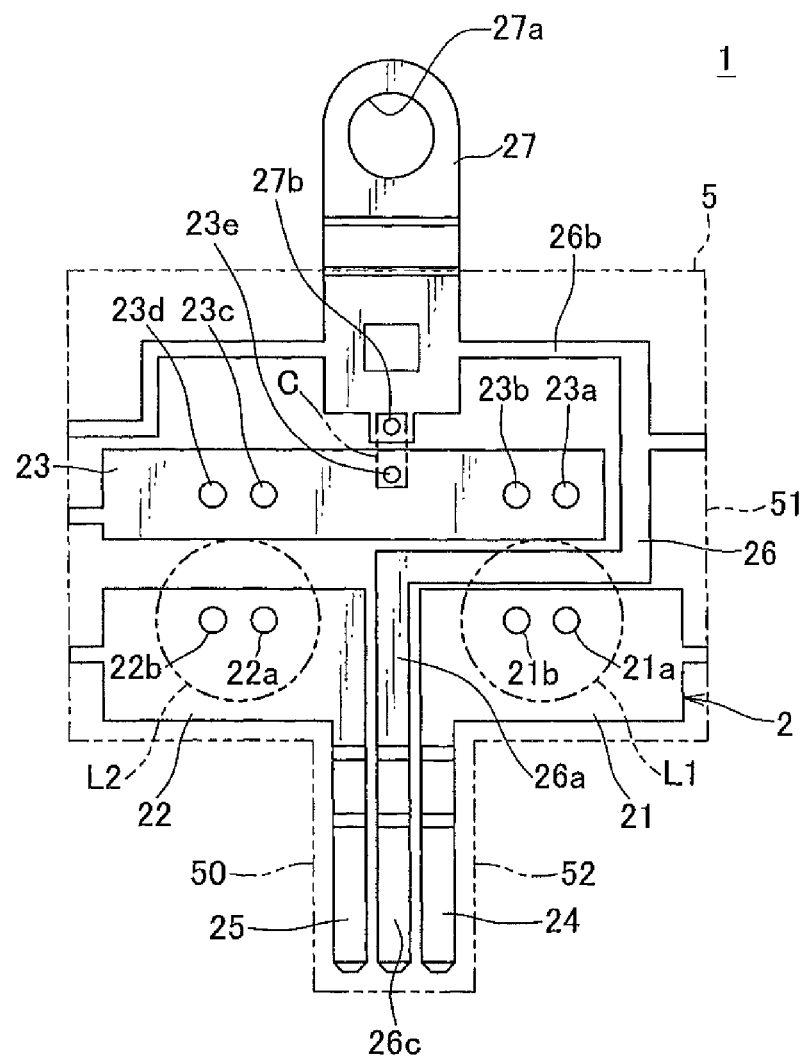
FIG. 4 is an explanatory diagram describing a configuration of the noise filter portion illustrated in FIG. 3.

Subsequently, the configuration of the filter constituting portion 2 and the noise filter portion 1 having the same will be described. As illustrated in FIGS. 3 and 4, the noise filter portion 1 includes: a male input terminal 24 connected to the electric-wire branched portion 61a; a male output terminal 25 connected to the electric-wire branched portion 62a; a pair of inductors L1 and L2 provided in a conductive path formed from the input terminal 24 to the output terminal 25; a first bus bar 21, a second bus bar 22, and a third bus bar 23 constituting the conductive path formed from the input terminal 24 to the output terminal 25; a ground bus bar 26 connected to the ground electric wire 63; a capacitor C; a bracket 27; a mounting member 3; and the housing 5.

The input terminal 24, the output terminal 25, the first bus bar 21, the second bus bar 22, the third bus bar 23, the ground bus bar 26, and the bracket 27 which are described above are formed into a shape illustrated in FIG. 4 in such a manner that a base metal punched from one metal plate is integrated with the mounting member 3 made of a synthetic resin by insert molding and unnecessary portions of the base metal are cut after the insert molding.

The input terminal 24 and the output terminal 25 are formed in an elongated plate shape and are disposed in parallel with each other at regular intervals.

The first bus bar 21 and the second bus bar 22 are formed in a substantially rectangular shape in plan view and are disposed at regular intervals such that short sides thereof are in parallel with each other. That is, the first bus bar 21 and the second bus bar 22 are disposed such that long sides thereof are aligned on a straight line. In addition, the input terminal 24 is formed integrally with the first bus bar 21 so as to be continuous with the short side of the first bus bar 21. The output terminal 25 is formed integrally with the second bus bar 22 so as to be continuous with the short side of the second bus bar 22. The third bus bar 23 is formed in an elongated rectangular shape and is disposed to have an interval from the first bus bar 21 and the second bus bar 22 such that the long side thereof is in parallel with the long sides of the first bus bar 21 and the second bus bar 22.

The bracket 27 is disposed on a side of the third bus bar 23 opposite to the side of the first bus bar 21 and the second bus bar 22. A bolt insertion hole 27a is provided at one end of the bracket 27. When a bolt passes through the bolt insertion hole 27a, the bracket 27 is fixed to a vehicle body panel with the bolt and thus is grounded (body ground).

The ground bus bar 26 is formed integrally with the bracket 27 and extends toward the input terminal 24 and the output terminal 25 by bypassing the third bus bar 23 from the bracket 27. The ground bus bar 26 includes a portion 26b connected to the bracket 27, a portion 26a disposed between the first bus bar 21 and the second bus bar 22, and a male terminal 26c extending from the portion 26a. The portion 26a is disposed between the short side of the first bus bar 21 and the short side of the second bus bar 22 and is also disposed on the same plane as the first bus bar 21 and the second bus bar 22. The terminal 26c is disposed between a position where the input terminal 24 is disposed and a position where the output terminal 25 is disposed.

In addition, the input terminal 24, the output terminal 25, the terminal 26c are located in a fitting portion 52 (to be described below) of the housing 5 and constitutes a connector 50 together with the fitting portion 52. The connector 50 is connected to the connector 7 of the branch line 6a. When the connector 50 is connected to the connector 7, the input terminal 24 is fitted with the terminal 71 attached to the leading end of the electric-wire branched portion 61a, the output terminal 25 is fitted with the terminal 72 attached to the leading end of the electric-wire branched portion 62a, and the terminal 26c is fitted with the terminal 73 attached to the leading end of the ground electric wire 63.

In this embodiment, the pair of inductors L1 and L2 use a toroidal coil configured by winding a coil on a toroidal core. One lead wire of the inductor L1 is inserted and soldered into/to a through hole 21a or a through hole 21b of the first bus bar 21 and the other lead wire thereof is inserted and soldered into/to a through hole 23a or a through hole 23b of the third bus bar 23. One lead wire of the inductor L2 is inserted and soldered into/to a through hole 22a or a through hole 22b of the second bus bar 22 and the other lead wire thereof is inserted and soldered into/to a through hole 23c or a through hole 23d of the third bus bar 23. In addition, the portion 26a of the ground bus bar 26 is disposed between a position where the inductor L1 is disposed and a position where inductor L2 is disposed, as illustrated in FIG. 4.

One lead wire of the capacitor C is inserted and soldered into/to a through hole 23e of the third bus bar 23 and the other lead wire thereof is inserted and soldered into/to a through hole 27b of the bracket 27.

The housing 5 is made of a synthetic resin and includes a cylindrical fitting portion 52 in which the input terminal 24, the output terminal 25, and the terminal 26c are located and a main body 51 accommodating other components. In addition, the bracket 27 is configured such that the bolt insertion hole 27a is located outside the housing 5. Thus, the noise filter portion 1 is configured in a unit form in which the input terminal 24, the output terminal 25, the first bus bar 21, the second bus bar 22, the third bus bar 23, the ground bus bar 26, the bracket 27, the mounting member 3, the pair of inductors L1 and L2, and the capacitor C are accommodated in the housing 5.

The noise filter portion 1 configured as described above removes noise (high frequency noise) from the current input from the electric-wire branched portion 61a and outputs the noise-removed current to the electric-wire branched portion 62a. In addition, the noise filter portion drops the noise carried on the ground electric wire 63 to the ground.

In addition, generally, noise propagation easily occurs in the vicinity of an inductance forming portion such as a coil due to electrostatic coupling in particular. In the noise filter portion 1, however, since the portion 26a of the ground bus bar 26 is disposed between the first bus bar 21 and the second bus bar 22 which are located between the inductors L1 and L2 where the electrostatic coupling easily occurs, the noise propagation due to the electrostatic coupling hardly occurs between the first bus bar 21 and the second bus bar 22. That is, when the noise is transmitted to the second bus bar 22 from the first bus bar 21 without passing through a predetermined circuit, since the noise is transmitted to the ground bus bar 26 which is closer than the second bus bar 22 and drops to the ground, the noise propagation due to the electrostatic coupling hardly occurs between the first bus bar 21 and the second bus bar 22. Accordingly, it is possible to shorten an interval between the first bus bar 21 and the second bus bar 22 located between the inductors L1 and L2 where the electrostatic coupling easily occurs and to reduce the size of the noise filter portion 1 while satisfying noise removal performance.

In the noise filter portion 1 described above, the input terminal 24, the first bus bar 21, the inductor L1 (corresponding to a "first inductance forming portion" in claims), and the third bus bar 23 constitute a part of the "first circuit portion 11". In addition, the output terminal 25, the second bus bar 22, the inductor L2 (corresponding to a "second inductance forming portion" in claims), and the third bus bar 23 constitute a part of the "second circuit portion 12". In addition, the ground bus bar 26 and the bracket 27 constitute a part of the "ground conductor 13".

Moreover, each of the input terminal 24, the first bus bar 21, the inductor L1, the third bus bar 23, the inductor L2, the second bus bar 22, the output terminal 25, the ground bus bar 26, the bracket 27 corresponds to the filter constituting portion 2.

(Second Embodiment)

Figure 5:
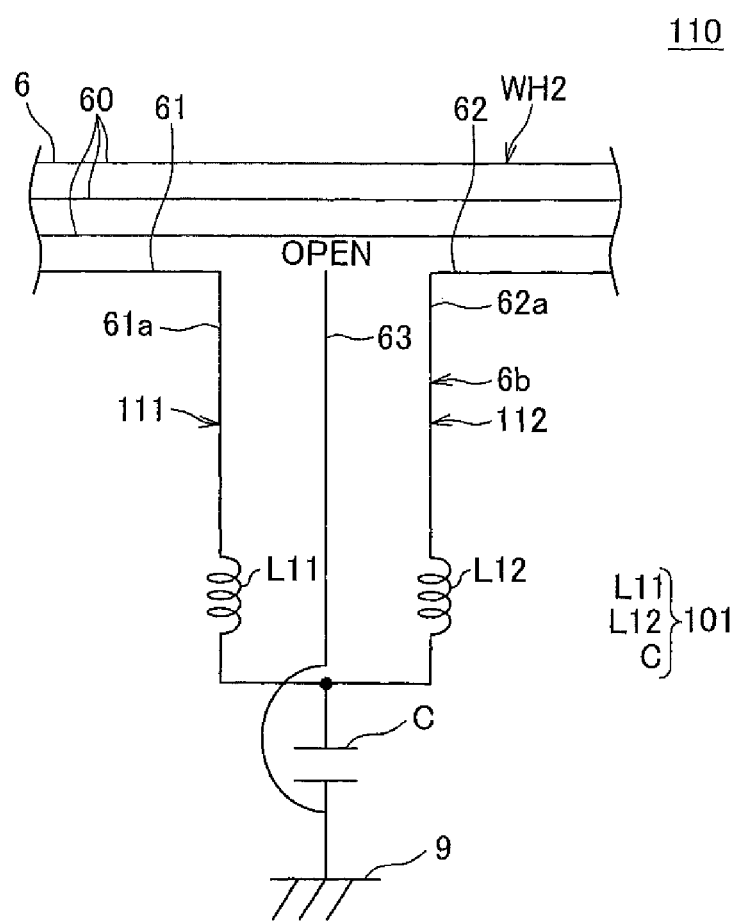
FIG. 5 is a circuit diagram of a noise removal circuit of a wire harness according to a second embodiment of the invention.
Figure 6:
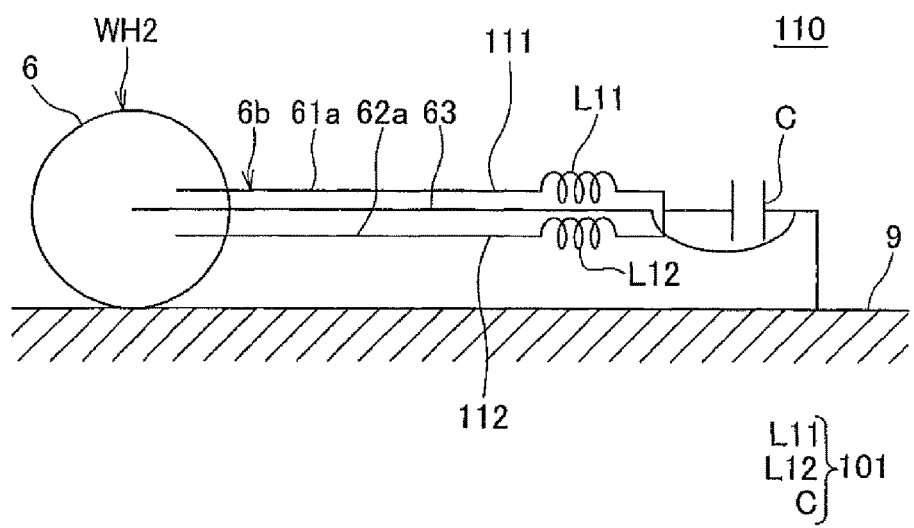
FIG. 6 is an explanatory diagram describing a configuration of the noise removal circuit illustrated in FIG. 5.
Figure 7:
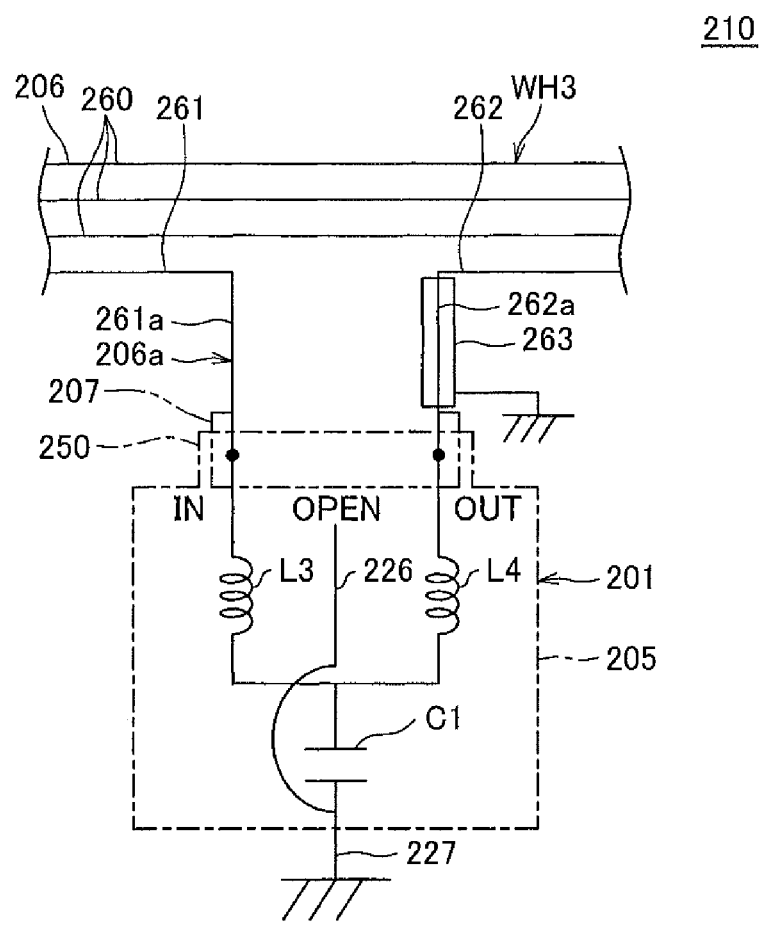
FIG. 7 is a circuit diagram of a noise removal circuit of a wire harness according to a third embodiment of the invention.

A "noise removal circuit of a wire harness" and a "wire harness assembly" according to a second embodiment of the invention will be described with reference to FIGS. 5 and 6. In FIGS. 5 and 6, the same components as in the first embodiment described above are denoted by the same reference numerals and the description thereof will not be presented.

A "noise removal circuit 110 of a wire harness" illustrated in FIGS. 5 and 6 is a circuit for removing noise of a wire harness WH2 and includes a " branch line 6*b*" as a "branch portion" which is branched from a main wire 6 of the wire harness WH2, a "noise filter portion 101" which is provided in the branch line 6*b* and is grounded, and a "vehicle body panel 9" forming a ground. The noise removal circuit 110 and the wire harness WH2 from which the noise is removed by the noise removal circuit 110 constitute the "wire harness assembly".

As illustrated in FIG. 5, the branch line 6*b* includes: a first circuit portion 111 which is electrically connected to the main wire 6 bundled with a plurality of electric wires 60, 61, and 62 while extending to a leading end from a base end of the branch line 6*b*; a second circuit portion 112 which is electrically connected to the main wire 6 while extending to the leading end from the base end of the branch line 6*b* and is electrically connected to the first circuit portion 111 at the leading end of the branch line 6*b*; and a ground electric wire 63 as a "ground conductor" which is disposed between the first circuit portion 111 and the second circuit portion 112 while extending to the leading end from the base end of the branch line 6*b* and has one end to be grounded and the other end to be opened.

The first circuit portion 111 includes an electric-wire branched portion 61*a* in which the electric wire 61 of the main wire 6 is branched from the main wire 6 and a first inductance forming portion L11 which is provided on the electric-wire branched portion 61*a*. The first inductance forming portion L11 is formed in such a manner that a ferrite bead is attached to an outer periphery of the electric-wire branched portion 61*a*.

The second circuit portion 112 includes an electric-wire branched portion 62*a*, in which the electric wire 62 of the main wire 6 is branched from the main wire 6, extending in parallel with the electric-wire branched portion 61*a* and a second inductance forming portion L12 which is provided on the electric-wire branched portion 62*a*. The second inductance forming portion L12 is formed in such a manner that a ferrite bead is attached to an outer periphery of the electric-wire branched portion 62*a*.

The first inductance forming portion L11 and the second inductance forming portion L12 are formed in such a manner that the ferrite bead is attached to the outer peripheries of the electric-wire branched portions 61*a* and 62*a*, respectively. However, other than the above, the electric-wire branched portions 61*a* and 62*a* may be formed by being spirally wound on a core and only the electric-wire branched portions 61*a* and 62*a* may be formed by being spirally wound without using the core.

The ground electric wire 63 extends between the pair of electric-wire branched portions 61*a* and 62*a* in parallel with these portions. In addition, an end of the ground electric wire 63 near the main wire 6 side is located in the vicinity of the center in a radial direction of the main wire 6 and is not electrically connected to any portions. That is, the end is opened. A tape is wound on the outer peripheries of the electric-wire branched portions 61*a* and 62*a* and the ground electric wire 63, so that the positional relation between these electric wires is fixed (the ground electric wire 63 is located at the center).

The noise filter portion 101 is configured by the first inductance forming portion L11, the second inductance forming portion L12, and the capacitor C electrically connected between the leading end of the branch line 6*b* and the ground (that is, vehicle body panel 9) which are described above. Thus, the noise filter portion 101 is not configured in a unit form.

The noise filter portion 101 configured as described above removes noise (high frequency noise) from the current flowing to the electric wire 61 and allows the noise-removed current to flow to the electric wire 62.

The vehicle body panel 9 is made of a metal plate and is disposed in the vicinity of the branch line 6*b* and along the branch line 6*b* as illustrated in FIG. 6. That is, the branch line 6*b* is laid in the vicinity of the vehicle body panel 9 and along the vehicle body panel 9. With this disposition, it is possible to more hardly cause noise propagation due to an inter-line capacitance between the electric-wire branched portion 61*a* and the electric-wire branched portion 62*a*.

In the first embodiment and the second embodiment described above, the electric-wire branched portion 61*a*, the electric-wire branched portion 62*a*, and the ground electric wire 63 which are independent coated electric wires are used in the "first circuit body", the "second circuit body", and the "ground conductor", respectively, which constitute the "branch portion", but the branch portion may be configured using a flexible flat cable or a flexible printed substrate in the invention.

(Third Embodiment)

A "noise removal circuit of a wire harness" and a "wire harness assembly" according to a third embodiment of the invention will be described with reference to FIGS. 7 to 11. A "noise removal circuit 210 of a wire harness" illustrated in FIG. 7 includes a "branch line 206*a*" which is branched from a main wire 206 of a wire harness WH3 and a "noise filter portion 201" which is connected to a leading end of the branch line 206*a*. The noise removal circuit 210 and the wire harness WH3 from which the noise is removed by the noise removal circuit 210 constitute the "wire harness assembly".

Figure 8:
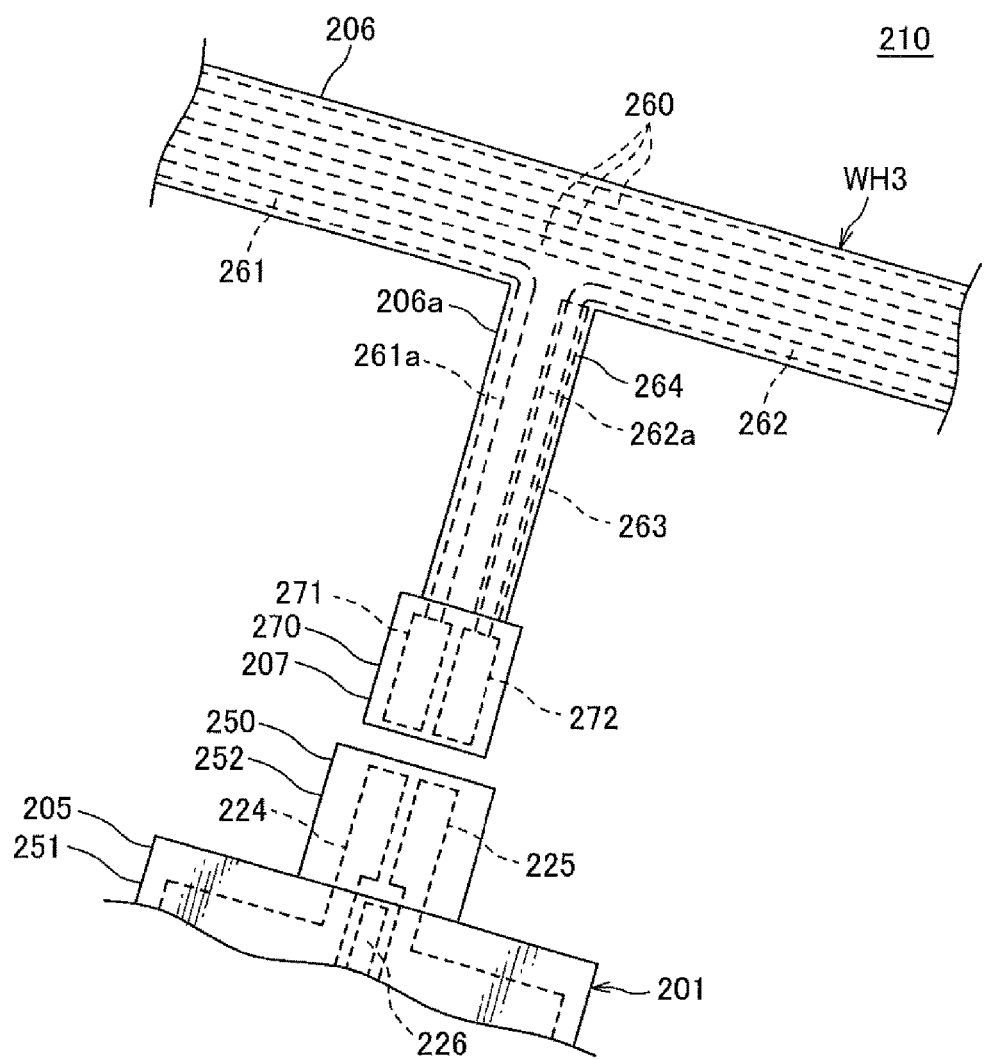
FIG. 8 is an explanatory diagram describing a configuration of the wire harness illustrated in FIG. 7.

The wire harness WH3 is laid in the vehicle and is used to connect devices mounted on the vehicle to each other. As illustrated in FIG. 8, the wire harness WH3 includes a main wire 206 configured by bundling a plurality of electric wires 260, 261, and 262 and a branch line 206*a*.

The branch line 206*a* includes: a pair of electric-wire branched portions 261*a* and 262*a* in which the electric wires 261 and 262 serving as a noise removal target among the electric wires 260, 261, and 262 of the main wire 206 are branched from the main wire 206 to extend in parallel with each other; a shield conductor 263 which covers the electric-wire branched portion 262*a* of the pair of electric-wire branched portions 261*a* and 262*a*; female terminals 271 and 272 which are attached to leading ends of the pair of electric-wire branched portions 261a and 262a, respectively; and a connector housing 270 which accommodates these terminals 271 and 272. The terminals 271 and 272 and the connector housing 270 constitute a connector 207. The connector 207 is connected to a connector 250 of a noise filter portion 201.

The pair of electric-wire branched portions 261a and 262a are a coated electric wire in which a core is covered with an insulation coating and extend in parallel with each other from the main wire 206 to the noise filter portion 201. The electric-wire branched portion 261a and the electric-wire branched portion 262a are electrically connected to each other through the noise filter portion 201. A tape 264 is wound on the outer peripheries of the pair of electric-wire branched portions 261a and 262a and the shield conductor 263 and puts them together into one bundle.

The shield conductor 263 uses a sheet made of aluminum in this embodiment and covers from one end to the other end of the electric-wire branched portion 262a while covering the entire outer periphery of the electric-wire branched portion 262a. The shield conductor 263 is grounded to, for example, a vehicle body panel. In addition, the shield conductor 263 may use, for example, a braid knitted in a cylindrical shape in addition to the sheet made of the aluminum.

Thus, since the electric-wire branched portion 262a is covered with the shield conductor 263, even when the electric-wire branched portions 261a and 262a come close to each other and the branch line 206a extends long, the noise propagation due to an inter-line capacitance hardly occurs between the electric-wire branched portion 261a and the electric-wire branched portion 262a. That is, when the noise is transmitted to the electric-wire branched portion 262a from the electric-wire branched portion 261a without passing through the noise filter portion 201, since the noise is transmitted to the shield conductor 263 which is closer than the electric-wire branched portion 262a and drops to a ground, the noise propagation hardly occurs between the electric-wire branched portion 261a and the electric-wire branched portion 262a.

Figure 9:
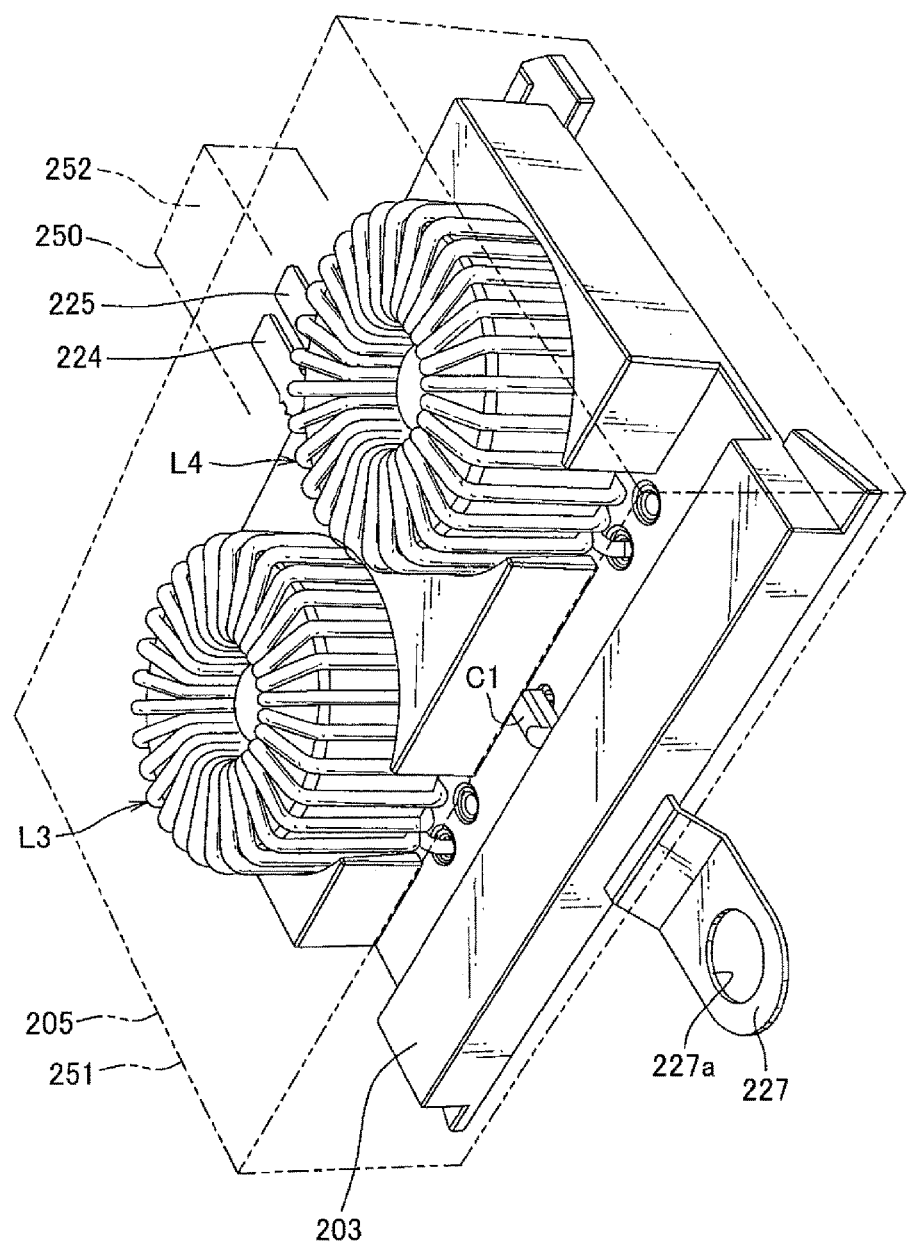
FIG. 9 is a perspective view of a noise filter portion constituting the noise removal circuit illustrated in FIG. 7.
Figure 10:
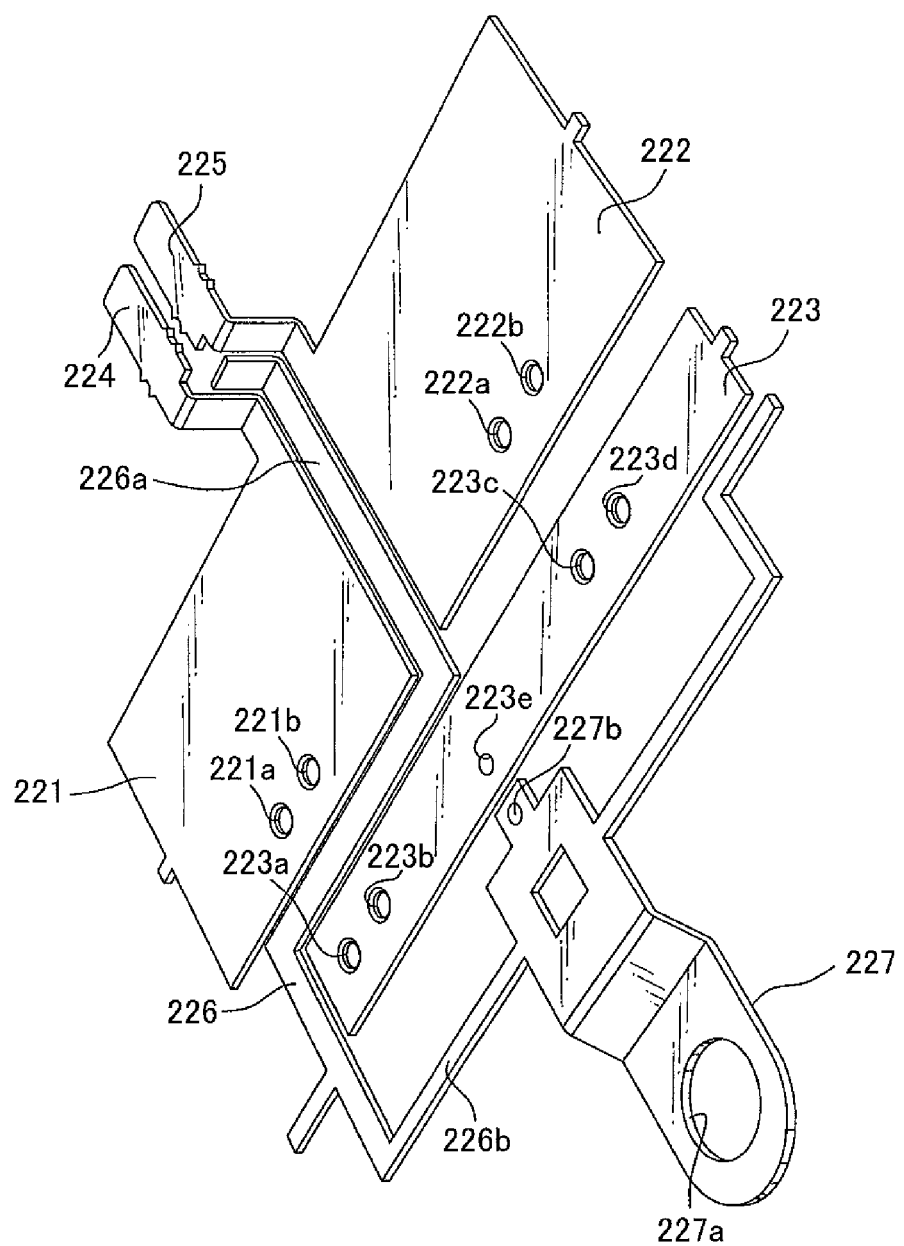
FIG. 10 is a perspective view of a plurality of bus bars and a bracket constituting the noise filter portion illustrated in FIG. 9.
Figure 11:
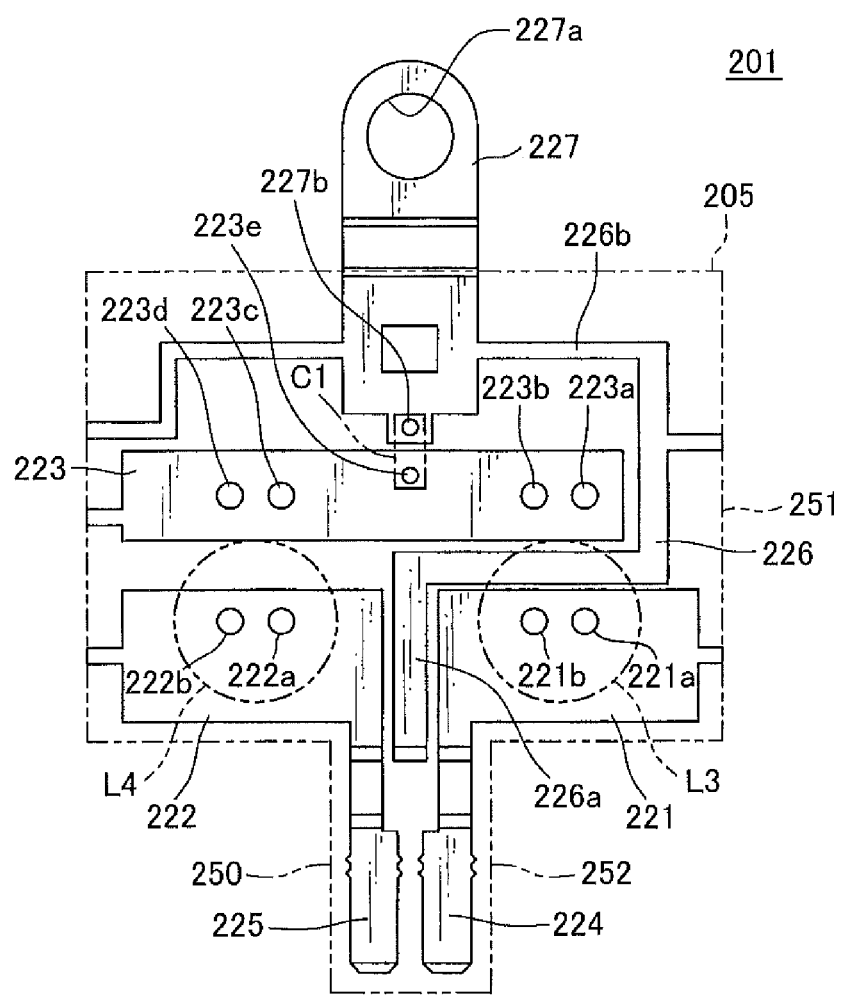
FIG. 11 is an explanatory diagram describing a configuration of the noise filter portion illustrated in FIG. 9.

Subsequently, the configuration of the noise filter portion 201 will be described. As illustrated in FIGS. 9 to 11, the noise filter portion 201 includes: a male input terminal 224 connected to the electric-wire branched portion 261a; a male output terminal 225 connected to the electric-wire branched portion 262a; a pair of inductors L3 and L4 provided in a conductive path formed from the input terminal 224 to the output terminal 225; a first bus bar 221, a second bus bar 222, and a third bus bar 223 constituting the conductive path formed from the input terminal 224 to the output terminal 225; a ground bus bar 226; a capacitor C1; a bracket 227; a mounting member 203; and a housing 205.

The input terminal 224, the output terminal 225, the first bus bar 221, the second bus bar 222, the third bus bar 223, the ground bus bar 226, and the bracket 227 which are described above are formed into a shape illustrated in FIGS. 10 and 11 in such a manner that a base metal punched from one metal plate is integrated with the mounting member 203 made of a synthetic resin by insert molding and unnecessary portions of the base metal are cut after the insert molding.

The input terminal 224 and the output terminal 225 are formed in an elongated plate shape and are disposed in parallel with each other at regular intervals.

The first bus bar 221 and the second bus bar 222 are formed in a substantially rectangular shape in plan view and are disposed at regular intervals such that short sides thereof are in parallel with each other. That is, the first bus bar 221 and the second bus bar 222 are disposed such that long sides thereof are aligned on a straight line. In addition, the input terminal 224 is formed integrally with the first bus bar 221 so as to be continuous with the short side of the first bus bar 221. The output terminal 225 is formed integrally with the second bus bar 222 so as to be continuous with the short side of the second bus bar 222. The third bus bar 223 is formed in an elongated rectangular shape and is disposed to have an interval from the first bus bar 221 and the second bus bar 222 such that the long side thereof is in parallel with the long sides of the first bus bar 221 and the second bus bar 222.

The bracket 227 is disposed on a side of the third bus bar 223 opposite to the side of the first bus bar 221 and the second bus bar 222. A bolt insertion hole 227a is provided at one end of the bracket 227. When a bolt passes through the bolt insertion hole 227a, the bracket 227 is fixed to a vehicle body panel with the bolt and thus is grounded (body ground).

The ground bus bar 226 is formed integrally with the bracket 227 and extends toward the input terminal 224 and the output terminal 225 by bypassing the third bus bar 223 from the bracket 227. The ground bus bar 226 includes a portion 226b connected to the bracket 227 and a portion 226a disposed between the first bus bar 221 and the second bus bar 222. In addition, a portion of the ground bus bar 226 other than the portion 226b connected to the bracket 227 is opened and is not electrically connected to any portions. The portion 226a is disposed between the short side of the first bus bar 221 and the short side of the second bus bar 222 and is also disposed on the same plane as the first bus bar 221 and the second bus bar 222.

In addition, the input terminal 224 and the output terminal 225 are located in a fitting portion 252 (to be described below) of the housing 205 and constitute a connector 250 together with the fitting portion 252. The connector 250 is connected to the connector 207 of the branch line 206a. When the connector 250 is connected to the connector 207, the input terminal 224 is fitted with the terminal 271 attached to the leading end of the electric-wire branched portion 261a, and the output terminal 225 is fitted with the terminal 272 attached to the leading end of the electric-wire branched portion 262a.

In this embodiment, the pair of inductors L3 and L4 use a toroidal coil configured by winding a coil on a toroidal core. One lead wire of the inductor L3 is inserted and soldered into/to a through hole 221a or a through hole 221b of the first bus bar 221 and the other lead wire thereof is inserted and soldered into/to a through hole 223a or a through hole 223b of the third bus bar 223. One lead wire of the inductor L4 is inserted and soldered into/to a through hole 222a or a through hole 222b of the second bus bar 222 and the other lead wire thereof is inserted and soldered into/to a through hole 223c or a through hole 223d of the third bus bar 223. In addition, the portion 226a of the ground bus bar 226 is disposed between a position where the inductor L3 is disposed and a position where inductor L4 is disposed, as illustrated in FIG. 11.

One lead wire of the capacitor C1 is inserted and soldered into/to a through hole 223e of the third bus bar 223 and the other lead wire thereof is inserted and soldered into/to a through hole 227b of the bracket 227.

The housing 205 is made of a synthetic resin and includes a cylindrical fitting portion 252 in which the input terminal 224 and the output terminal 225 are located and a main body 251 accommodating other components. In addition, the bracket 227 is configured such that the bolt insertion hole 227a is located outside the housing 205. Thus, the noise filter portion 201 is configured in a unit form in which the input terminal 224, the output terminal 225, the first bus bar 221, the second bus bar 222, the third bus bar 223, the ground bus bar 226, the bracket 227, the mounting member 203, the pair of inductors L3 and L4, and the capacitor C1 are accommodated in the housing 205.

The noise filter portion 201 configured as described above removes noise (high frequency noise) from the current input from the electric-wire branched portion 261a and outputs the noise-removed current to the electric-wire branched portion 262a.

In addition, generally, noise propagation easily occurs in the vicinity of an inductance forming portion such as a coil due to electrostatic coupling in particular. In the noise filter portion 201, however, since the portion 226a of the ground bus bar 226 is disposed between the first bus bar 221 and the second bus bar 222 which are located between the inductors L3 and L4 where the electrostatic coupling easily occurs, the noise propagation due to the electrostatic coupling hardly occurs between the first bus bar 221 and the second bus bar 222. That is, when the noise is transmitted to the second bus bar 222 from the first bus bar 221 without passing through a predetermined circuit, since the noise is transmitted to the ground bus bar 226 which is closer than the second bus bar 222 and drops to the ground, the noise propagation due to the electrostatic coupling hardly occurs between the first bus bar 221 and the second bus bar 222. Accordingly, it is possible to shorten an interval between the first bus bar 221 and the second bus bar 222 located between the inductors L3 and L4 where the electrostatic coupling easily occurs and to reduce the size of the noise filter portion 201 while satisfying noise removal performance.

In the noise filter portion 201 described above, the input terminal 224, the first bus bar 221, the inductor L3, and the third bus bar 223 constitute a "first circuit portion". In addition, the output terminal 225, the second bus bar 222, the inductor L4, and the third bus bar 223 constitute a "second circuit portion". In addition, the ground bus bar 226 constitutes a "ground conductor". That is, the ground bus bar 226 is disposed between the first circuit portion and the second circuit portion.

In addition, in the branch line 206a, the input terminal 224, the first bus bar 221, the inductor L3, the third bus bar 223, the inductor L4, the second bus bar 222, and the output terminal 225 constitute a "branch portion".

The above noise removal circuit 210 of the wire harness can hardly cause the noise propagation between the electric-wire branched portion 261a and the electric-wire branched portion 262a by the shield conductor 263 in the branch line 206a and can hardly cause the noise propagation between the first bus bar 221 and the second bus bar 222 by the ground bus bar 226 in the noise filter portion 201. Accordingly, it is possible to remove the noise of the wire harness WH3 with high accuracy.

In the above noise removal circuit 210 of the wire harness, furthermore, the noise filter portion 201 has the ground bus bar 226. However, the ground bus bar 226 is not an essential component in the invention and thus the noise filter portion may be configured without the ground bus bar.

(Fourth Embodiment)

Figure 12:
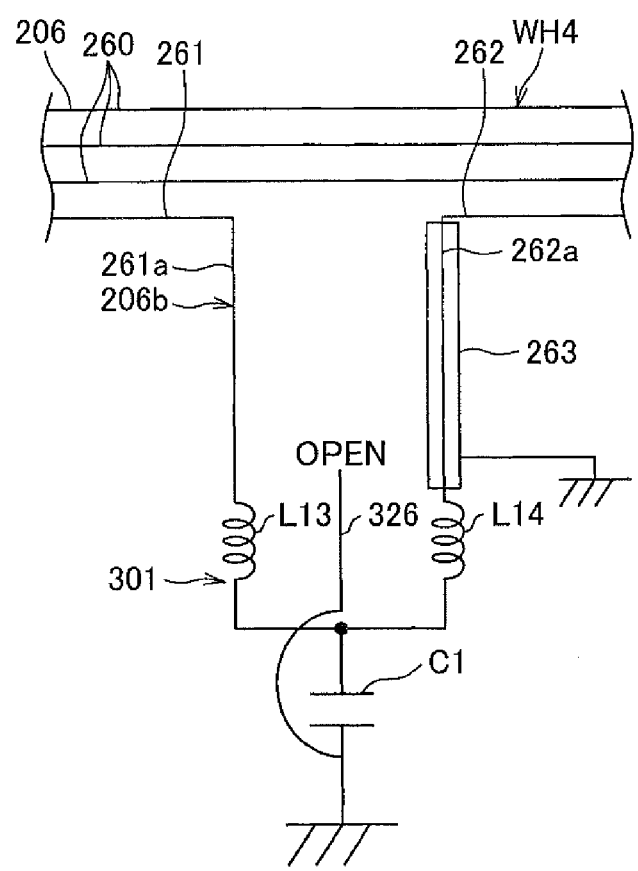
FIG. 12 is a circuit diagram of a noise removal circuit of a wire harness according to a fourth embodiment of the invention.

A "noise removal circuit of a wire harness" and a "wire harness assembly" according to a fourth embodiment of the invention will be described with reference to FIG. 12. In FIG. 12, the same components as in the third embodiment described above are denoted by the same reference numerals and the description thereof will not be presented.

A "noise removal circuit 310 of a wire harness" illustrated in FIG. 12 includes a " branch line 206b" as a "branch portion" which is branched from a main wire 206 of a wire harness WH4, and a "noise filter portion 301" which is provided in the branch line 206b. The noise removal circuit 310 and the wire harness WH4 from which the noise is removed by the noise removal circuit 310 constitute the "wire harness assembly".

The branch line 206b includes: a pair of electric-wire branched portions 261a and 262a in which the electric wires 261 and 262 serving as a noise removal target among the electric wires 260, 261, and 262 of the main wire 206 are branched from the main wire 206 to extend in parallel with each other; a shield conductor 263; and a ground electric wire 326. The electric-wire branched portion 261a and the electric-wire branched portion 262a are electrically connected to a leading end of the branch line 206b.

A first inductance forming portion L13 is provided on the electric-wire branched portion 261a. The first inductance forming portion L13 is formed in such a manner that a ferrite bead is attached to an outer periphery of the electric-wire branched portion 261a. In the electric-wire branched portion 261a, a portion ranging from a base end of the branch line 206b to the first inductance forming portion L13 corresponds to a "first conductor wire portion". Furthermore, in the electric-wire branched portion 261a, a portion ranging from the first inductance forming portion L13 to the leading end of the branch line 206b corresponds to a "first circuit portion".

A second inductance forming portion L14 is provided on the electric-wire branched portion 262a. The second inductance forming portion L14 is formed in such a manner that a ferrite bead is attached to an outer periphery of the electric-wire branched portion 262a. In the electric-wire branched portion 262a, a portion ranging from the base end of the branch line 206b to the second inductance forming portion L14 corresponds to a "second conductor wire portion". Furthermore, in the electric-wire branched portion 262a, a portion ranging from the second inductance forming portion L14 to the leading end of the branch line 206b corresponds to a "second circuit portion".

The first inductance forming portion L13 and the second inductance forming portion L14 are formed in such a manner that the ferrite bead is attached to the outer peripheries of the electric-wire branched portions 261a and 262a, respectively. However, other than the above, the electric-wire branched portions 261a and 262a may be formed by being spirally wound on a core and only the electric-wire branched portions 261a and 262a may be formed by being spirally wound without using the core.

The shield conductor 263 covers a portion (that is, second conductor wire portion) ranging from the base end of the branch line 206b to the second inductance forming portion L14 in the electric-wire branched portion 262a and also covers the entire outer periphery of the portion. The shield conductor 263 is grounded to, for example, a vehicle body panel.

The ground electric wire 326 is a coated electric wire in which a core is covered with an insulation coating and extends between the pair of electric-wire branched portions 261a and 262a in parallel with these portions. In addition, the ground electric wire 326 is disposed between the portion (that is, first circuit portion) ranging from the first inductance forming portion L13 to the leading end of the branch line 206b in the electric-wire branched portion 261a and the portion (that is, second circuit portion) ranging from the second inductance forming portion L14 to the leading end of the branch line 206b in the electric-wire branched portion 262a. One end of the ground electric wire 326 located at the leading end of the branch line 206b is grounded to, for example, the vehicle body panel. In addition, the other end of the ground electric wire 326 on the main wire 206 side is not electrically connected to any portion. That is, the other end thereof is opened. The ground electric wire 326 corresponds to a "ground conductor".

The outer peripheries of the electric-wire branched portions 261a and 262a, the shield conductor 263, and the ground electric wire 326 which are described above are wound by a tape, and the positional relation therebetween is fixed such that the ground electric wire 326 is located between the electric-wire branched portions 261a and 262a.

The noise filter portion 301 includes: the portion (that is, first circuit portion) ranging from the first inductance forming portion L13 to the leading end of the branch line 206b in the electric-wire branched portion 261a; the portion (that is, second circuit portion) ranging from the second inductance forming portion L14 to the leading end of the branch line 206b in the electric-wire branched portion 262a; the ground electric wire 326; and a capacitor C1 which is electrically connected between the leading end of the branch line 206b and the ground (for example, vehicle body panel). Thus, the noise filter portion 301 is not configured in a unit form.

The noise filter portion 301 configured as described above removes noise (high frequency noise) from the current flowing to the electric wire 261 and allows the noise-removed current to flow to the electric wire 262.

The above noise removal circuit 310 of the wire harness can hardly cause the noise propagation due to an inter-line capacitance between the electric-wire branched portion 261a and the electric-wire branched portion 262a over the entire region from the base end to the leading end of the branch line 206b by the shield conductor 263 and the ground electric wire 326. Accordingly, it is possible to remove the noise of the wire harness WH4 with high accuracy.

In the above noise removal circuit 310 of the wire harness, furthermore, the noise filter portion 301 has the ground electric wire 326. However, the ground electric wire 326 is not an essential component in the invention and thus the noise filter portion may be configured without the ground electric wire.

(Fifth Embodiment)

Figure 13:
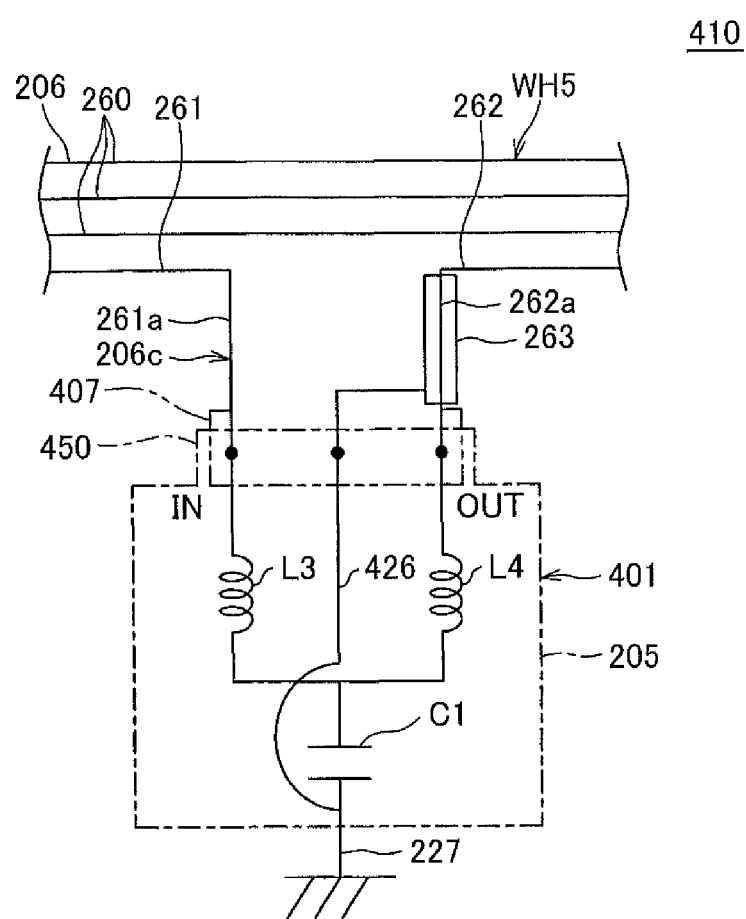
FIG. 13 is a circuit diagram of a noise removal circuit of a wire harness according to a fifth embodiment of the invention.
Figure 14:
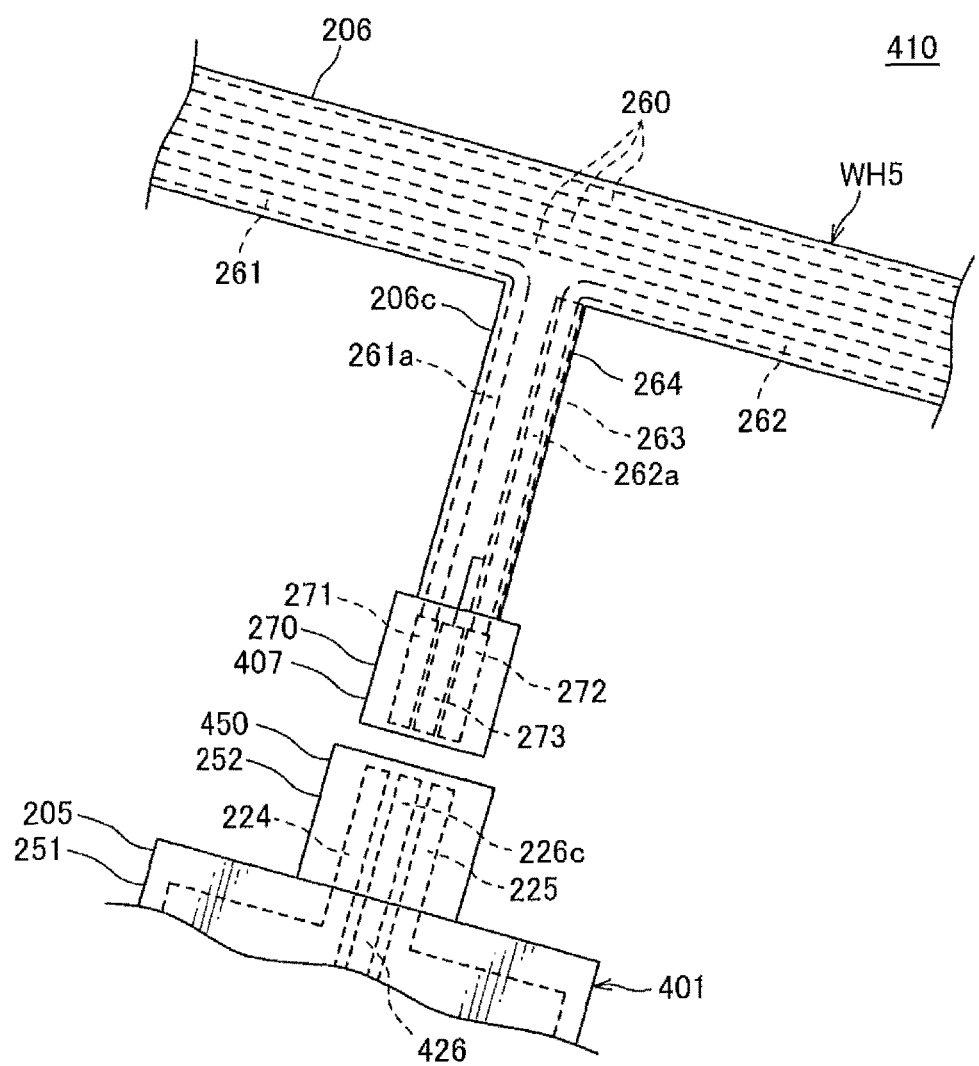
FIG. 14 is an explanatory diagram describing a configuration of the wire harness illustrated in FIG. 13.

A "noise removal circuit of a wire harness" and a "wire harness assembly" according to a fifth embodiment of the invention will be described with reference to FIGS. 13 and 14. In FIGS. 13 and 14, the same components as in the third embodiment described above are denoted by the same reference numerals and the description thereof will not be presented.

A "noise removal circuit 410 of a wire harness" illustrated in FIG. 13 includes a " branch line 206c" as a "branch portion" which is branched from a main wire 206 of a wire harness WH5, and a "noise filter portion 401" which is provided in the branch line 206c. The noise removal circuit 410 and the wire harness WH5 from which the noise is removed by the noise removal circuit 410 constitute the "wire harness assembly".

As illustrated in FIG. 14, the branch line 206c includes: electric-wire branched portions 261a and 262a which are branched to extend from the main wire 206; a shield conductor 263 which covers the electric-wire branched portion 262a; female terminals 271 and 272 which are attached to leading ends of the electric-wire branched portions 261a and 262a, respectively; a female terminal 273 which is electrically connected to the shield conductor 263 in a direct manner or an indirect manner using other members; and a connector housing 270 which accommodates these terminals 271, 272, and 273. The terminals 271, 272, and 273 and the connector housing 270 constitute a connector 407. The connector 407 is connected to a connector 450 of the noise filter portion 401.

The noise filter portion 401 includes a ground bus bar 426 instead of the ground bus bar 226 described in the third embodiment. The ground bus bar 426 includes a male terminal 226c extending from a portion 226a (see FIGS. 10 and 11) disposed between a first bus bar 221 and a second bus bar 222. The noise filter portion 401 has the same configuration as the noise filter portion 201 of the third embodiment except for having the ground bus bar 426 instead of the ground bus bar 226.

The terminal 226c is disposed between a position where an input terminal 224 is disposed and a position where an output terminal 225 is disposed and is located in a fitting portion 252 of a housing 205, thereby constituting a connector 450. The connector 450 is connected to the connector 407 of the branch line 206c. When the connector 450 is connected to the connector 407, the terminal 226c provided in the ground bus bar 426 is fitted with the terminal 273 which is electrically connected to the shield conductor 263.

Since the noise filter portion 401 configured as described above is configured such that the ground bus bar 426 is disposed between the position where the input terminal 224 is disposed and the position where the output terminal 225 is disposed, it is possible to hardly cause noise propagation due to electrostatic coupling between the input terminal 224 and the output terminal 225. In addition, since the terminal 226c provided in the ground bus bar 426 is connected to the shield conductor 263 through the terminal 273, it is possible to drop the noise carried on the shield conductor 263 to the ground through the ground bus bar 426.

In this way, the noise removal circuit 410 of the wire harness can be configured to simplify a grounding structure of the shield conductor 263.

In the third to fifth embodiments described above, the shield conductor 263 is configured to cover the electric-wire branched portion 262a. In the invention, however, the shield conductor 263 may be configured to cover the electric-wire branched portion 261a and the shield conductor 263 may be configured to cover both of the electric-wire branched portion 261a and the electric-wire branched portion 262a.

Another aspect of the "wire harness assembly" of the invention will be described below. In the following, the "wire harness assembly" is described as a "wire harness".

Figure 15:
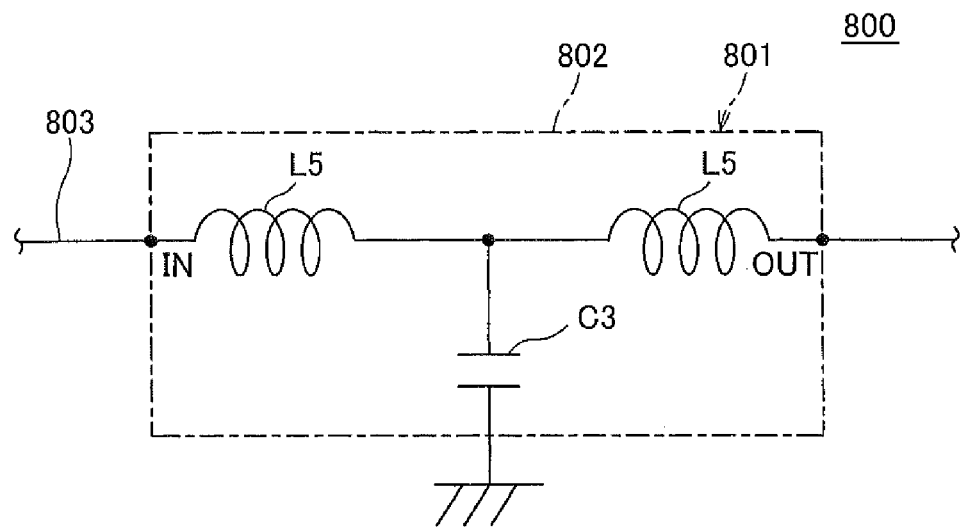
FIG. 15 is a circuit diagram of a traditional electric circuit incorporated with an LCL filter.

From the past, various noise filters have been used to remove electric noise mixed in an electric circuit. FIG. 15 is a circuit diagram of a traditional electric circuit incorporated with an LCL filter.

An electric circuit 800 illustrated in FIG. 15 is a circuit in which an LCL filter 801 is incorporated in a conductive path 803. The LCL filter 801 is configured in a unit form in which a pair of inductors L5 connected to the conductive path 803 in series and a capacitor C3 to drop noise flowing between the pair of inductors L5 are accommodated in a housing 802.

Furthermore, noise of an in-vehicle wire harness has been often removed using a capacitor, but the wire harness provided with the LCL filter has been required in recent years as described.

With respect to the wire harness provided with the LCL filter, first, the inventors consider the case of connecting the LCL filter 801 described above to the electric wire of the wire harness. In this case, however, when the LCL filter 801 configured in a unit form in which a plurality of components are accommodated in the housing is attached to the electric wire, there are problems that the attached portion increases in size and weight and the degree of freedom in laying on the vehicle body becomes low.

Next, the inventors investigate a case of constituting the LCL filter using inductance of the electric wire itself of the wire harness instead of using the inductor as an element. However, as results of the investigation, it is found that the inductance value is not sufficiently obtained by only the electric wire extending in a linear shape and thus a desired LCL filter is not configured.

Therefore, according to the invention, the LCL filter is provided and the wire harness having a simple configuration is required.

In order to solve the above problems, this embodiment relates to an in-vehicle wire harness provided with the LCL filter including a first inductance forming portion, a second inductance forming portion, and a capacitor and may be the first inductance forming portion and the second inductance forming portion are formed using one electric wire.

In this embodiment, the first inductance forming portion and the second inductance forming portion may be formed in such a manner that the electric wire is spirally wound.

In this embodiment, the electric wire may be formed to be wound on a core.

In this embodiment, the first inductance forming portion and the second inductance forming portion may be formed in such a manner that a component made of a magnetic material is attached to an outer periphery of the electric wire.

In this embodiment, the capacitor may be connected and grounded to a portion between the first inductance forming portion and the second inductance forming portion in the electric wire.

According to this embodiment, since the in-vehicle wire harness is provided with the LCL filter including the first inductance forming portion, the second inductance forming portion, and the capacitor and the first inductance forming portion and the second inductance forming portion are formed using one electric wire, it is possible to simplify the configuration of the wire harness.

In addition, since the first inductance forming portion and the second inductance forming portion are formed in such a manner that the electric wire is spirally wound, the LCL filter can be configured by the small number of components and thus the configuration of the wire harness can be simplified.

In addition, since the electric wire is formed by being wound on the core, it is possible to easily adjust an inductance value of the first inductance forming portion and the second inductance forming portion to a desired value.

In addition, since the first inductance forming portion and the second inductance forming portion are formed in such a manner that the component made of the magnetic material is attached to the outer periphery of the electric wire, it is possible to easily adjust the inductance value of the first inductance forming portion and the second inductance forming portion to the desired value. In addition, it is possible to easily perform assembling work of the wire harness.

Specific aspects of the "wire harness" of the invention will be described below with reference to FIGS. 16 to 18, as sixth to eighth embodiments.

(Sixth Embodiment)

A "wire harness" according to a sixth embodiment of the invention will be described with reference to FIG. 16.

Figure 16:
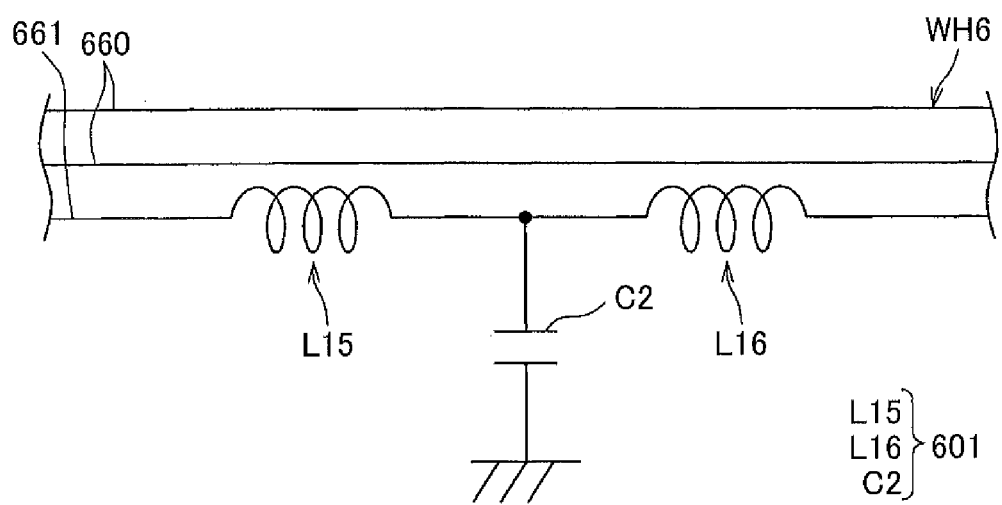
FIG. 16 is an explanatory diagram of a wire harness according to a sixth embodiment of the invention.

A wire harness WH6 illustrated in FIG. 16 is laid in the vehicle to connect devices mounted on the vehicle to each other and includes a plurality of electric wires 660 and 661 which are bundled. The wire harness WH6 is provided with an LCL filter 601 including a first inductance forming portion L15, a second inductance forming portion L16, and a capacitor C2.

The first inductance forming portion L15 and the second inductance forming portion L16 are formed using one electric wire 661 serving as a noise removal target among the plurality of electric wires 660 and 661. The electric wire 661 is a coated electric wire in which a core is covered with an insulation coating. Furthermore, in this embodiment, the first inductance forming portion L15 and the second inductance forming portion L16 are formed at two places on the electric wire 661, respectively, which are spirally wound.

Furthermore, when it is difficult to maintain the electric wire 661 in the spiral shape, it may be maintained in the spiral shape by winding an adhesive tape on the spirally wound portion.

The capacitor C2 is connected to a portion between the first inductance forming portion L15 and the second inductance forming portion L16 in the electric wire 661 and is grounded to, for example, a vehicle body panel.

The LCL filter 601 configured as described above removes noise (high frequency noise) from the current flowing to the electric wire 661. Since the first inductance forming portion L15 and the second inductance forming portion L16 are formed using only one electric wire 661 in the LCL filter 601, it is possible to reduce the number of components and thus to simplify the configuration of the wire harness WH6.

(Seventh Embodiment)

A "wire harness" according to a seventh embodiment of the invention will be described with reference to FIG. 17. In FIG. 17, the same components as in the sixth embodiment described above are denoted by the same reference numerals and the description thereof will not be presented.

Figure 17:
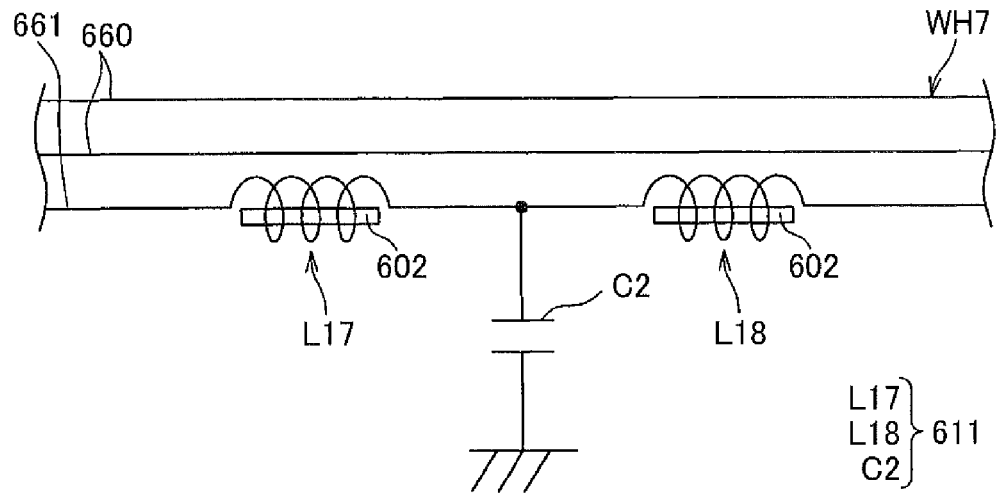
FIG. 17 is an explanatory diagram of a wire harness according to a seventh embodiment of the invention.

A wire harness WH7 illustrated in FIG. 17 is provided with an LCL filter 611 including a first inductance forming portion L17, a second inductance forming portion L18, and a capacitor C2.

In this embodiment, the first inductance forming portion L17 and the second inductance forming portion L18 are formed in such a manner that one electric wire 661 serving as a noise removal target among a plurality of electric wires 660 and 661 is spirally wound on a core 602 made of a magnetic material such as ferrite.

Since the LCL filter 611 configured as described above is configured using the core 602, it is possible to easily adjust an inductance value of the first inductance forming portion L17 and the second inductance forming portion L18 to a desired value.

(Eighth Embodiment)

A "wire harness" according to an eighth embodiment of the invention will be described with reference to FIG. 18. In FIG. 18, the same components as in the sixth and seventh embodiments described above are denoted by the same reference numerals and the description thereof will not be presented.

Figure 18:
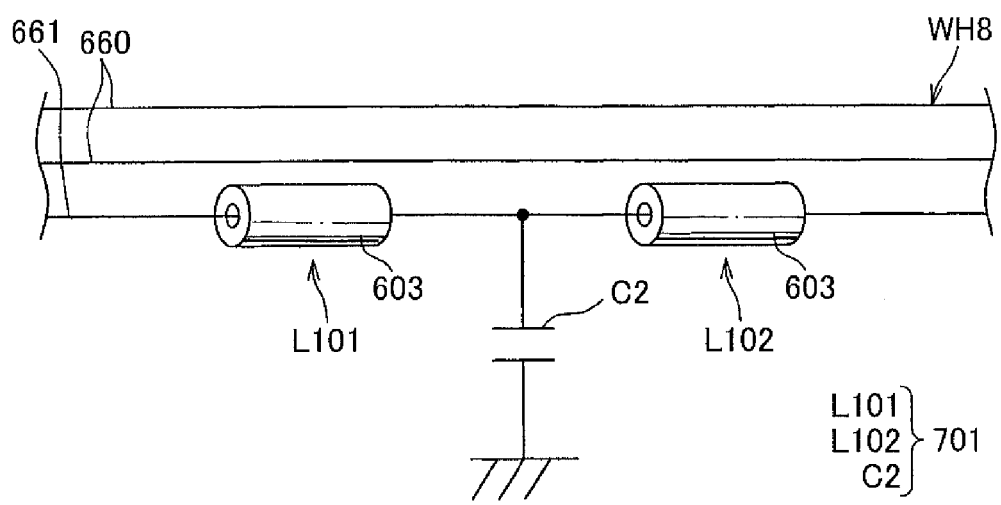
FIG. 18 is an explanatory diagram of a wire harness according to an eighth embodiment of the invention.
Figure 19:
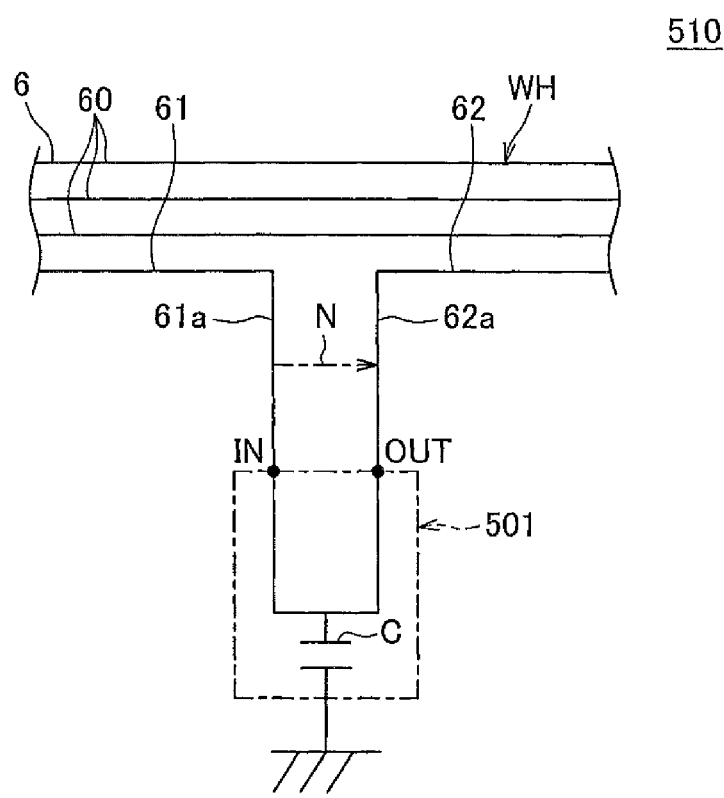
FIG. 19 is a circuit diagram of a noise removal circuit of the traditional wire harness.

A wire harness WH8 illustrated in FIG. 18 is provided with an LCL filter 701 including a first inductance forming portion L101, a second inductance forming portion L102, and a capacitor C2.

In this embodiment, the first inductance forming portion L101 and the second inductance forming portion L102 are formed in such a manner that a ferrite bead 603 is attached to an outer periphery of one electric wire 661 serving as a noise removal target among a plurality of electric wires 660 and 661.

Since the LCL filter 701 configured as described above is configured using the ferrite bead 603, it is possible to easily adjust an inductance value of the first inductance forming portion L101 and the second inductance forming portion L102 to a desired value. In addition, since the ferrite bead 603 is easily post-attached to the electric wire 661, it is possible to easily perform assembling work of the wire harness WH8.

The ferrite bead 603 is used as a "component made of a magnetic material" in the eighth embodiment described above. In the invention, however, instead of the ferrite bead 603, a component obtained by embedding or assembling the magnetic material into a part of an exterior member such as a corrugated tube or a protector may be attached to the outer periphery of the electric wire 661; or an exterior member such as a corrugated tube or a protector made of a material including the magnetic material may be attached to the outer periphery of the electric wire 661.

While certain embodiments have been described, these embodiments have been presented by way of example only, and are not intended to limit the scope of the inventions. That is, various modifications may be made without departing from the spirit of the invention.

REFERENCE SINGS LIST

1,101 noise filter portion
4 branch portion
6 main wire
6*b* branch line (branch portion)
10,110 noise removal circuit of wire harness
11,110 first circuit portion
12, 112 second circuit portion
13 ground conductor
63 ground electric wire
WH1, WH2 wire harness

What is claimed is:
1. A noise removal circuit of a wire harness comprising:
a branch portion that is branched from a main wire of the wire harness; and a noise filter portion that is provided in the branch portion to be grounded,
wherein the branch portion includes:
a first circuit portion that is electrically connected to the main wire while extending to a leading end from a base end of the branch portion;
a second circuit portion that is electrically connected to the main wire while extending to the leading end from the base end of the branch portion and is electrically connected to the first circuit portion at the leading end of the branch portion; and
a ground conductor that is disposed between the first circuit portion and the second circuit portion while extending to the leading end from the base end of the branch portion and has one end to be grounded and the other end to be opened,
wherein the branch portion is separately divided into a branch line branched from the main wire and a filter constituting portion constituting the noise filter portion, the noise filter portion is configured in a unit form in which the filter constituting portion is accommodated in a housing, and the branch line and the noise filter portion are connected to each other using a connector.

2. The noise removal circuit of the wire harness according to claim 1, wherein the first circuit portion includes a first inductance forming portion and the second circuit portion includes a second inductance forming portion.

3. The noise removal circuit of the wire harness according to claim 2, wherein a metal plate being grounded or forming a ground is disposed along the branch portion.

4. A wire harness assembly comprising: the noise removal circuit of the wire harness according to claim 3; and a wire harness from which noise is removed by the noise removal circuit.

5. A wire harness assembly comprising: the noise removal circuit of the wire harness according to claim 2; and a wire harness from which noise is removed by the noise removal circuit.

6. The noise removal circuit of the wire harness according to claim 1, wherein a metal plate being grounded or forming a ground is disposed along the branch portion.

7. A wire harness assembly comprising: the noise removal circuit of the wire harness according to claim 6; and a wire harness from which noise is removed by the noise removal circuit.

8. A wire harness assembly comprising: the noise removal circuit of the wire harness according to claim 1; and a wire harness from which noise is removed by the noise removal circuit.

* * * * *